(12) United States Patent
Kwon

(10) Patent No.: US 7,154,759 B2
(45) Date of Patent: Dec. 26, 2006

(54) MOUNTING STRUCTURE FOR INTEGRATED CIRCUIT

(75) Inventor: Joong-kil Kwon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 262 days.

(21) Appl. No.: 10/997,962

(22) Filed: Nov. 29, 2004

(65) Prior Publication Data

US 2005/0270723 A1    Dec. 8, 2005

(30) Foreign Application Priority Data

Jun. 3, 2004    (KR) ............... 10-2004-0040189

(51) Int. Cl.
*H05K 7/06* (2006.01)
*H01G 2/14* (2006.01)

(52) U.S. Cl. .............. 361/782; 361/15; 361/783; 257/724

(58) Field of Classification Search .............. None
See application file for complete search history.

(56) References Cited

U.S. PATENT DOCUMENTS 6,061,241 A * 5/2000 Handforth et al. .......... 361/704
6,304,447 B1 * 10/2001 Bortolini et al. ........... 361/699
6,411,524 B1 * 6/2002 Chen et al. ................ 361/803
6,466,454 B1 * 10/2002 Jitaru ........................ 361/836
6,492,773 B1 * 12/2002 Gyoten et al. ............... 315/56
6,577,066 B1 * 6/2003 Kominami et al. .......... 315/58
6,879,488 B1 * 4/2005 Takeda et al. .............. 361/704

FOREIGN PATENT DOCUMENTS

| JP | 11-261258 | 9/1999 |
| JP | 2000-261125 | 9/2000 |
| KR | 2002-0077065 A | 10/2002 |

* cited by examiner

*Primary Examiner*—John B. Vigushin
(74) *Attorney, Agent, or Firm*—Stanzione & Kim, LLP

(57) ABSTRACT

In a mounting structure of an integrated circuit, an electrolytic capacitor for smoothing power of a heating element is disposed out of range of thermal effect of the heating element, and a ceramic capacitor for supplementing the operation of the electrolytic capacitor is additionally disposed between the electrolytic capacitor and the heating element. Accordingly, a long lifespan of the electrolytic capacitor and a stable operation of the heating element can be guaranteed.

24 Claims, 5 Drawing Sheets

MOUNTING STRUCTURE FOR INTEGRATED CIRCUIT

CROSS-REFERENCE TO RELATED APPLICATIONS

This application claims the benefit of Korean Patent Application No. 2004-40189, filed Jun. 3, 2004, in the Korean Intellectual Property Office, the disclosure of which is incorporated herein by reference.

BACKGROUND OF THE INVENTION

1. Field of the Invention

The present general inventive concept relates to a mounting structure for an integrated circuit in which an element which is sensitive to an ambient temperature and a temperature in operation (hereinbelow, referred to as a 'temperature-sensitive element'), and an element which generates heat during the operation (hereinbelow, referred to as 'heating element') mixedly exist.

2. Description of the Related Art

An integrated circuit is composed by mounting a plurality of elements selected for certain desired functions on a printed circuit board (PCB). A lifespan of a temperature-sensitive element such as an electrolytic capacitor is considerably influenced by an ambient temperature and a temperature in operation.

The electrolytic capacitor in the integrated circuit is generally used for smoothing electric power. The electrolytic capacitor uses a thin oxidation film for a dielectric thereof, and aluminum for an electrode thereof. Since the dielectric can be formed very thin, the capacitor can obtain a greater capacity compared to its volume.

A ceramic capacitor uses a material of a high inductivity, such as a titanium-barium as for a dielectric element between electrodes. Since inductance is low in the ceramic capacitor, the ceramic capacitor has a good high-frequency property, and therefore, it is often used in a bypass of a high frequency.

In a general integrated circuit, a plurality of capacitors are disposed in parallel at the nearest location from a power pin of respective elements in order to guarantee a normal operation of the elements. Also, the electrolytic capacitor is disposed near a power source to reduce ripples of a power part, thereby stably supplying the power.

FIG. 1 is a plan view illustrating a mounting structure of a general integrated circuit. On the PCB 10, a central processing unit (CPU) 20, a voltage regulator 30, a motor driver 40, an interface 50 and a memory 60 are properly disposed.

The CPU 20, the voltage regulator 30, the motor driver 40, the interface 50 and the memory 60 are respectively connected to one or more ceramic capacitors 21, 31, 41, 51, and 61 and electrolytic capacitors 32, 42, 52 and 62.

The electrolytic capacitor, for example, an electrolytic capacitor 32 connected to an output terminal of the voltage regulator 30 is dedicated to restrain fluctuation of an output voltage according to an immediate change of a load.

The electrolytic capacitor is used not only at a power terminal but also near an element which is far from a power source, for an optimal operation of the element. Especially, the electrolytic capacitor 42 is always used near a power pin of the motor driver 40 which consumes a lot of electric current at once when starting its driving.

For an optimal power-smoothing effect, the electrolytic capacitors 32 to 62 are disposed as near the power pin of the element as possible.

A lifespan of the electrolytic capacitors 32 to 62 largely depends on the ambient temperature and the temperature in operation. FIG. 2 is a graph illustrating the lifespan changing according to the temperature of the electrolytic capacitor 32 to 62. As shown in FIG. 2, the temperature of every electrolytic capacitor 32 to 62 remarkably decreases at a high temperature.

However, in general integrated circuits, especially in the mounting structure of the integrated circuit where a temperature-sensitive element and a heating element compatibly exist, the heating elements, such as the voltage regulator 30 and the motor driver 40, and the electrolytic capacitors 32 and 42 are disposed regardless of the sensitivity of the temperature-sensitive element, as shown in FIG. 1.

Therefore, as the heat generated from the heating elements 30 and 40 are transmitted to the electrolytic capacitors 32 and 42, that are the temperature-sensitive elements, the temperature in operations of the electrolytic capacitors 32 and 42 increase, thereby shortening the lifespan of the electrolytic capacitors 32 and 42. As a result, the lifespan of the whole device becomes short, and a solution for guaranteeing a long lifespan of the electrolytic capacitor 32 and 42 is required.

SUMMARY OF THE INVENTION

In order to solve the foregoing and/or other problems, it is an aspect of the present general inventive concept to provide a mounting structure of an integrated circuit, capable of improving a lifespan of a temperature-sensitive element which is subject to heat from a heating element, by locating the temperature-sensitive element in an improved arrangement with respect to the heating element.

Additional aspects and advantages of the present general inventive concept will be set forth in part in the description which follows and, in part, will be obvious from the description, or may be learned by practice of the general inventive concept.

The foregoing and/or other aspects and advantages of the present general inventive concept may be achieved by providing a mounting structure of an integrated circuit in which a heating element generates heat while operating, and an electrolytic capacitor to smooth power of the heating element are mounted on a printed circuit board (PCB), wherein the electrolytic capacitor is disposed out of range of a thermal effect of the heating element, and a ceramic capacitor is disposed between the electrolytic capacitor and the heating element to supplement an operation of the electrolytic capacitor.

According to an aspect of the present general inventive concept, the electrolytic capacitor may be spaced by approximately 10~35 mm from the heating element.

The heating element may comprise an element of which a surface temperature is equal to or more than 70° C. When the surface temperature of the heating elements is substantially 70~90° C., the electrolytic capacitors can be spaced apart from the heating elements by substantially 10~20 mm, and when the surface temperature is substantially 90~120° C., the electrolytic capacitors can be spaced apart from the heating elements by substantially 20~35 mm.

The heating element may be one of a central processing unit (CPU), a voltage regulator, a motor driver and a memory.

The foregoing and/or other aspects and advantages of the present general inventive concept may also be achieved by providing a mounting structure of an integrated circuit in which a first and a second heating elements which generate heat during an operation, and a temperature-sensitive element are mounted on a PCB, wherein the temperature-sensitive element is disposed out of range of a thermal effect of the first and the second heating elements, and an assistant element which is less sensitive to heat is disposed to supplement an operation of the temperature-sensitive element between the temperature-sensitive element and the first and the second heating elements, respectively.

The temperature-sensitive element may be an electrolytic capacitor to smooth power of the first and the second heating elements, and the assistant element may be a ceramic capacitor. For the assistant element, a film capacitor or a laminated ceramic capacitor may be used as an acceptable alternative to the ceramic capacitor.

According to an aspect of the present general inventive concept, the electrolytic capacitor may be spaced apart from the first or the second heating elements by approximately 10~35 mm.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
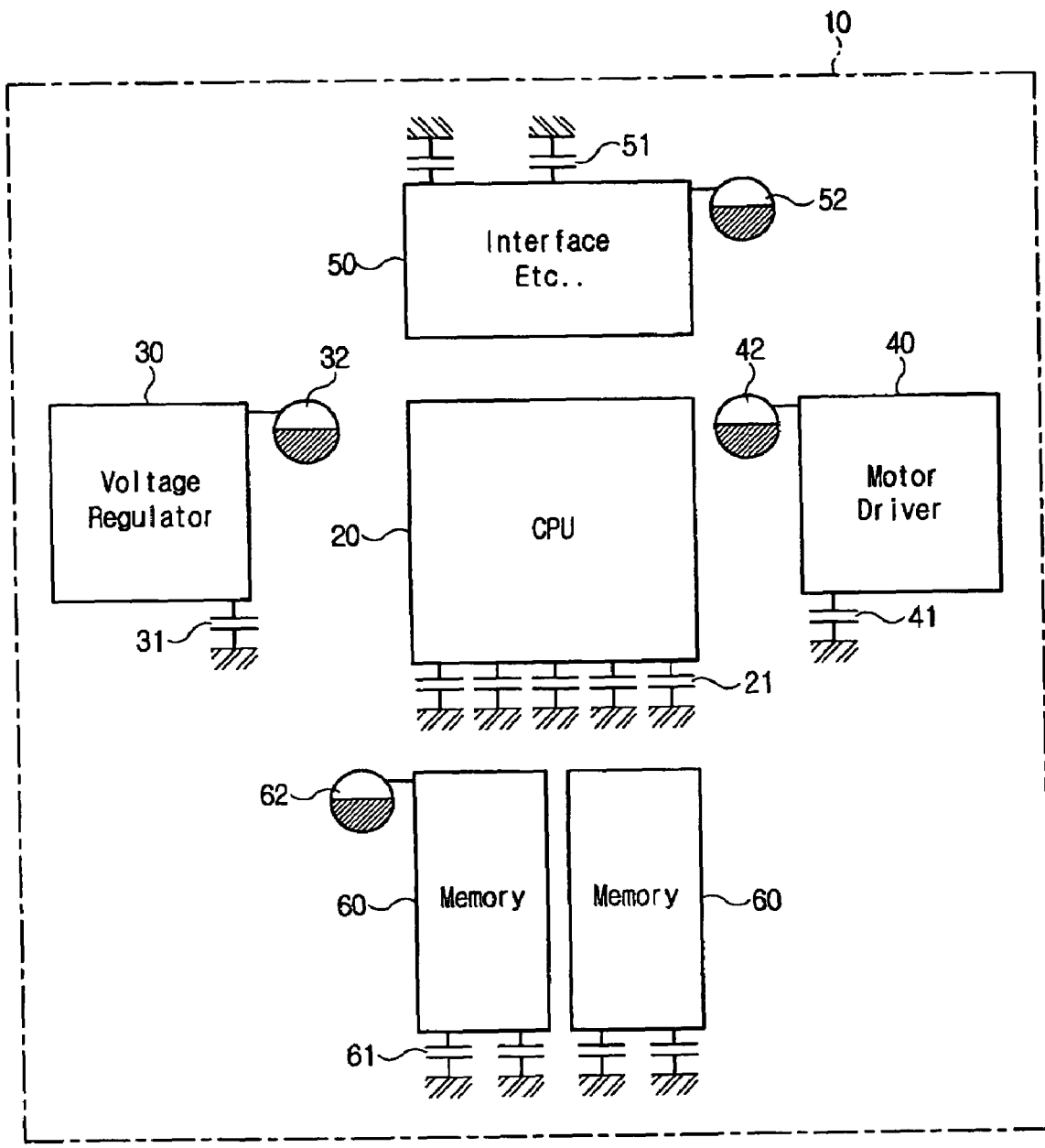
FIG. 1 is a plan view illustrating a mounting structure of a general integrated circuit.
Figure 2:
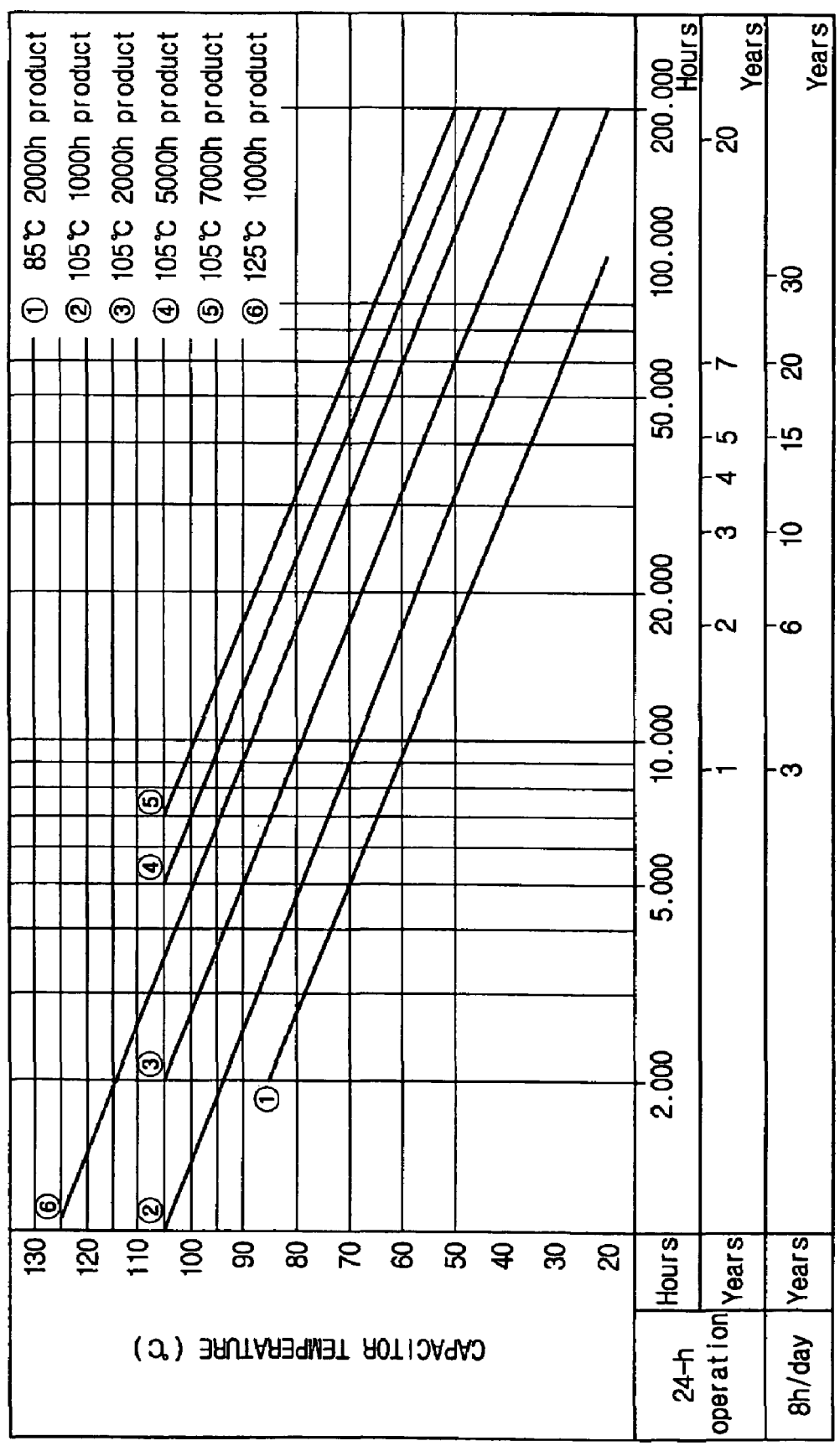
FIG. 2 is a graph illustrating a lifespan changing according to a temperature of an electrolytic capacitor, which is an example of a temperature-sensitive element.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 3:
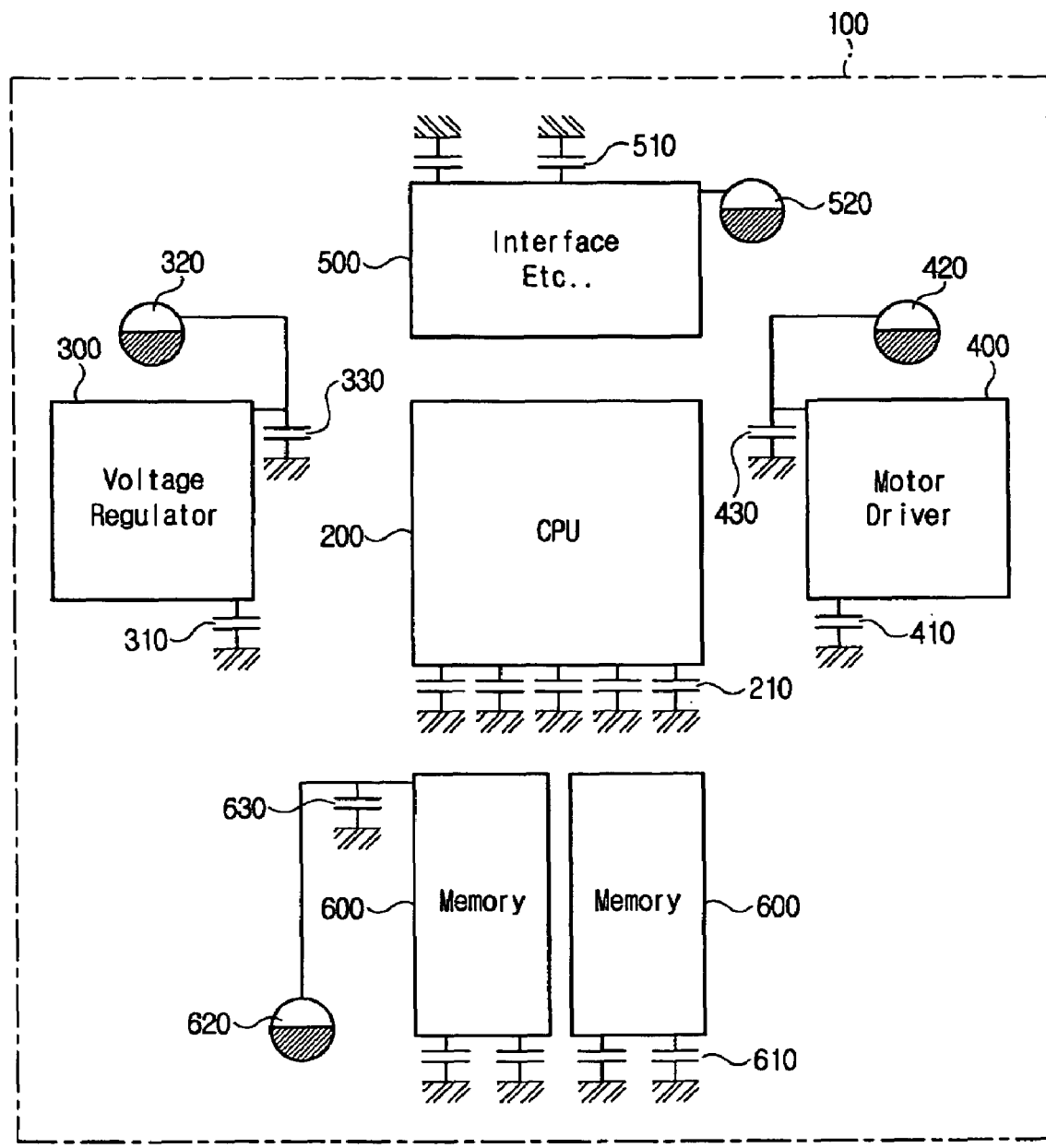
FIG. 3 is a plan view illustrating a mounting structure of an integrated circuit according to an embodiment of the present general inventive concept.

FIG. 3 is a plan view illustrating a mounting structure of an integrated circuit according to an embodiment of the present general inventive concept. Referring to FIG. 3, a printed circuit board (PCB) 100 may comprise elements including a central processing unit 200 (CPU), a voltage regulator 300, a motor driver 400, an interface 500 and a memory 600 which are formed thereon in sequence.

The CPU 200, the voltage regulator 300, the motor driver 400, the interface 500 and the memory 600, being properly disposed on the PCB 100, are respectively connected to first ceramic capacitors 210, 310,410, 510 and 610 and electrolytic capacitors 320, 420, 520 and 620, which are used to smooth power of the elements. This is a basic structure of an integrated circuit which is similar to that described in a conventional integrated circuit of FIG. 1.

In the mounting structure of the integrated circuit according to an aspect of the present general inventive concept, the electrolytic capacitors 320 to 620 are disposed beyond a range of a thermal effect of the corresponding elements, that is, the voltage regulator 300, the motor driver 400 and the memory 600. The voltage regulator 300, the motor driver 400 and the memory 600 are heating elements, and the electrolytic capacitors 320, 420 and 620 are temperature-sensitive elements.

The electrolytic capacitors 320, 420 and 620 can be spaced apart from the respectively corresponding heating elements, that is, the voltage regulator 300, the motor driver 400 and the memory 600 by approximately 10~35 mm. According to this, the electrolytic capacitors 320, 420 and 620 may be less affected by the heat generated during an operation of the elements, and therefore, the lifespan can be extended.

However, when the electrolytic capacitors 320, 420 and 620 are spaced apart from the elements 300, 400 and 600 by a certain distance, the power-smoothing operation can be deteriorated. To compensate this, second ceramic capacitors 330, 430 and 630 to assist the operation of the electrolytic capacitors 320, 420 and 620 can be disposed between the electrolytic capacitors 320, 420 and 620 and the respectively corresponding heating elements 300, 400 and 600. Since the second ceramic capacitors 330, 430 and 630 are not as sensitive to the ambient temperature and the temperature in operation, compared to the electrolytic capacitors, they can help the electrolytic capacitors 320, 420 and 620 stably operate.

For the elements helping the electrolytic capacitors, film capacitors or laminated capacitors may also be used as acceptable alternatives to the second ceramic capacitors 330,430 and 630.

According to an embodiment of the present invention, the heating elements may comprise an element of which a surface temperature is equal to or more than approximately 70° C. When the surface temperature of the heating elements is substantially 70~90° C., the electrolytic capacitors 320, 420 and 620 can be spaced apart from the heating elements by substantially 10~20 mm. When the surface temperature is substantially 90~120° C., the electrolytic capacitors 320, 420 and 620 can be spaced apart from the heating elements by substantially 20~35 mm.

Figure 4A:
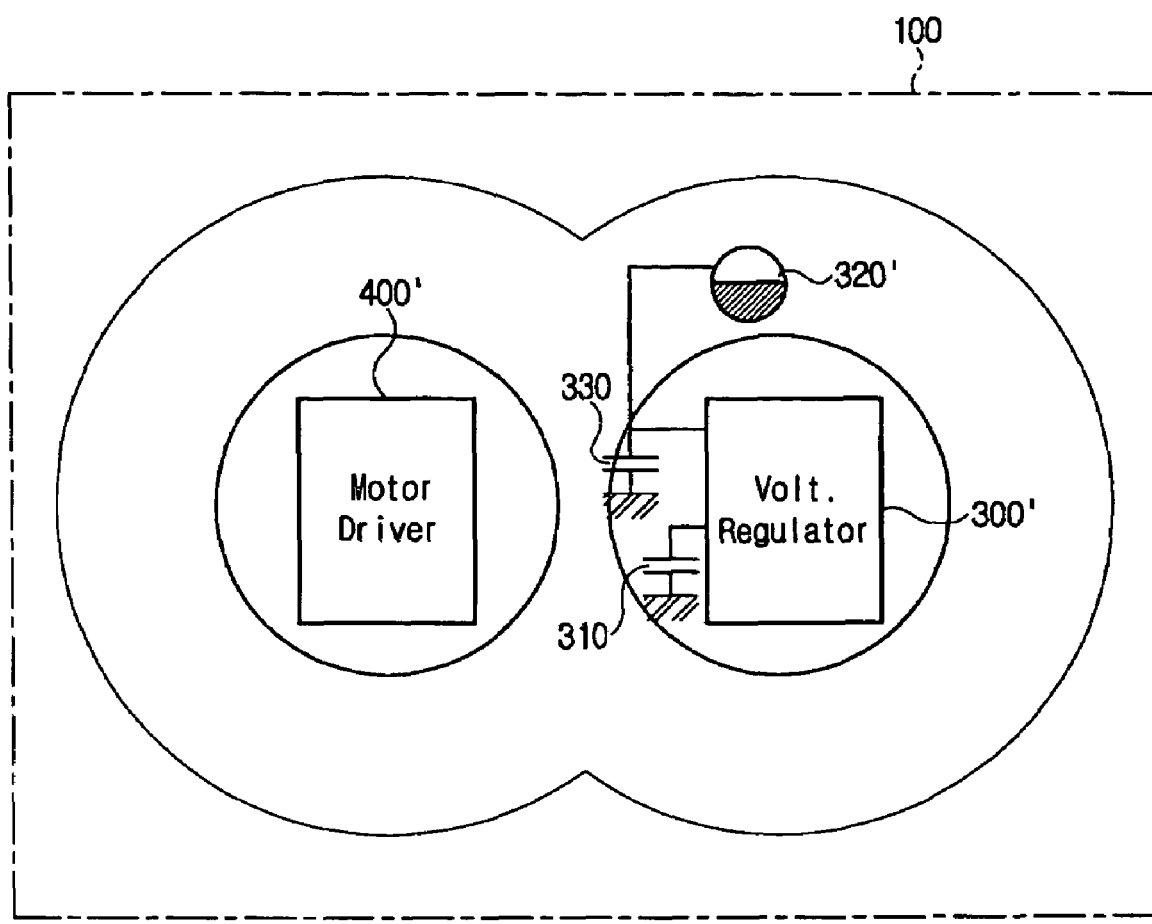
FIGS. 4A and 4B are plan views of main parts illustrating a mounting structure of an integrated circuit according to another embodiment of the present general inventive concept.
Figure 4B:
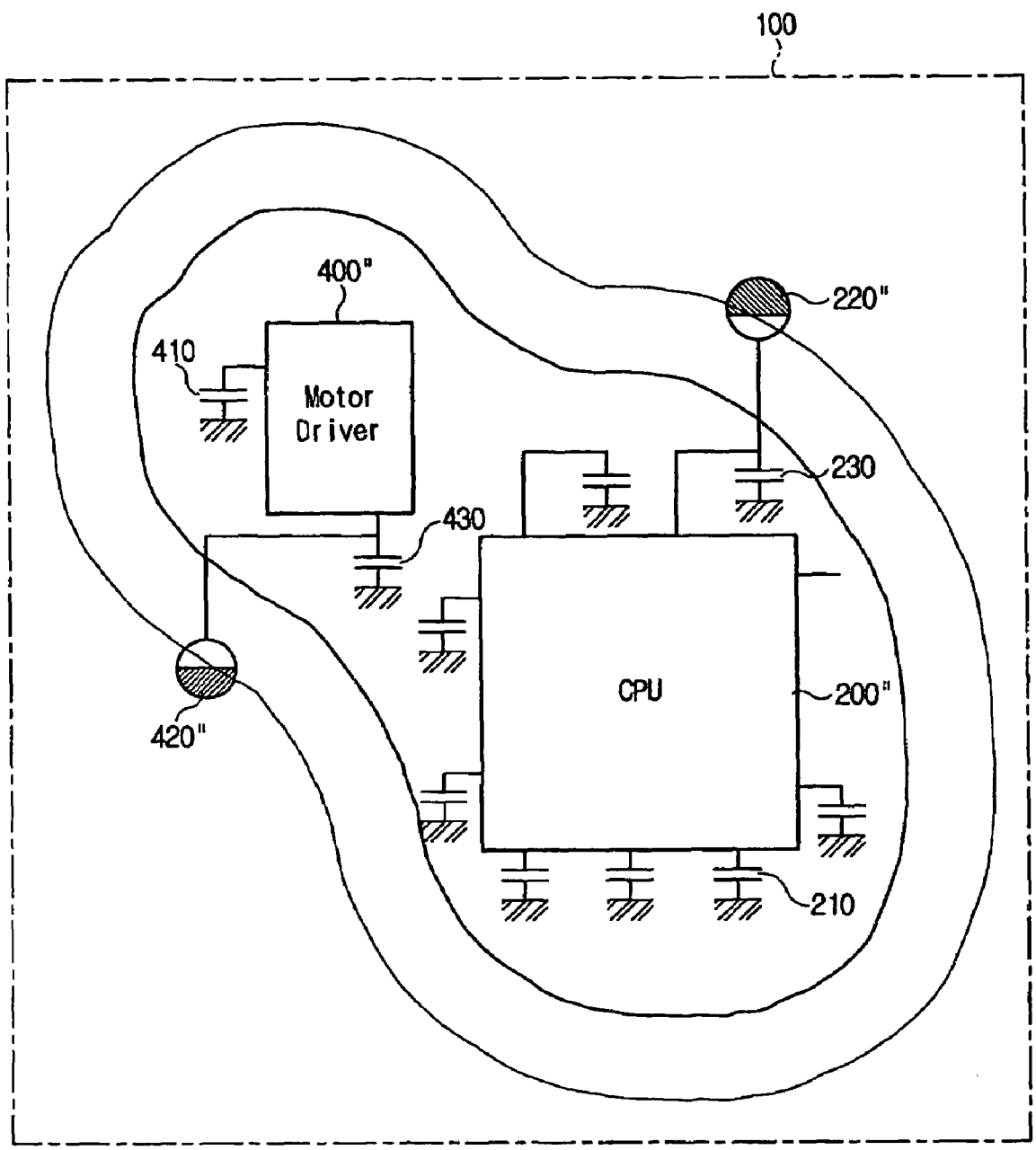

FIGS. 4A and 4B are plan views of main parts illustrating a mounting structure of the integrated circuit according to another embodiment of the present general inventive concept.

FIG. 4A illustrates the arrangement of an electrolytic capacitor 320' which is the temperature-sensitive element with respect to a voltage regulator 300' and a motor driver 400', which are respectively first and second heating elements, being disposed adjacent to each other. In this case, the electrolytic capacitor 320' can be spaced apart from the first heating element 300' by a certain distance but is not disposed between the two heating elements 300' and 400'.

FIG. 4B illustrates the arrangement of electrolytic capacitors 420" and 220" with respect to a motor driver 400" and a CPU 200", which are respectively the first and second heating elements in this embodiment. The electrolytic capacitors 420" and 220" can be disposed to be spaced apart from the first and second heating elements 400" and 200" by at least a certain distance, so that the electrolytic capacitors 420" and 220" are out of the range of the thermal effect of both the first and second heating elements 400" and 200".

The other features of the mounting structure and the operation are the same as in FIG. 3. Therefore, detailed description thereof will not be repeated.

As can be appreciated from the above description, the electrolytic capacitor which is thermally sensitive can be spaced apart from the heating element by a certain distance, and the ceramic capacitor can be interposed between the electrolytic capacitor and the heating element to assist the operation of the electrolytic capacitor. Therefore, both a long lifespan of the electrolytic capacitor and a stable operation of the heating element can be guaranteed. Also, the lifespan of the whole device is improved.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A mounting structure of an integrated circuit in which a heating element which generates heat during an operation, and an electrolytic capacitor to smooth power of the heating element are mounted on a printed circuit board (PCB),
wherein the electrolytic capacitor is disposed out of a range of a thermal effect of the heating element, and a ceramic capacitor to supplement an operation of the electrolytic capacitor is disposed between the electrolytic capacitor and the heating element.

2. The mounting structure of claim 1, wherein the electrolytic capacitor is spaced by approximately 10~35 mm from the heating element.

3. The mounting structure of claim 1, wherein the heating element comprises an element of which a surface temperature is equal to or more than approximately 70° C., and when the surface temperature of the heating element is substantially 70~90° C., the electrolytic capacitor is spaced apart from the heating element by substantially 10~20 mm, and when the surface temperature is substantially 90~120° C., the electrolytic capacitor is spaced apart from the heating element by substantially 20~35 mm.

4. The mounting structure of claim 1, wherein the ceramic capacitor comprises a film capacitor or a laminated ceramic capacitor.

5. The mounting structure of claim 1, wherein the heating element comprises one of a central processing unit (CPU), a voltage regulator, a motor driver and a memory.

6. A mounting structure of an integrated circuit in which a first and a second heating elements which generate heat during an operation, and a temperature-sensitive element are mounted on a printed circuit board (PCB),
wherein the temperature-sensitive element is disposed out of a range of a thermal effect of the first and the second heating elements, and an assistant element which is less sensitive to heat is disposed to supplement an operation of the temperature-sensitive element between the temperature-sensitive element and the first and the second heating elements, respectively.

7. The mounting structure of claim 6, wherein the temperature-sensitive element comprises an electrolytic capacitor to smooth power of the first and the second heating elements, and the assistant element comprises a ceramic capacitor.

8. The mounting structure of claim 7, wherein the electrolytic capacitor is spaced apart from the first or the second heating elements by approximately 10~35 mm.

9. The mounting structure of claim 7, wherein the ceramic capacitor comprises a film capacitor or a laminated ceramic capacitor.

10. The mounting structure of claim 8, wherein the first and the second heating elements are respectively a motor driver and a voltage regulator.

11. The mounting structure of claim 8, wherein the first and the second heating elements are respectively a CPU and a motor driver.

12. A mounting structure of an integrated circuit in which a plurality of heating elements and a plurality of temperature-sensitive elements are mounted on a printed circuit board (PCB),
wherein the temperature-sensitive elements are disposed out of a range of a thermal effect of all of the heating elements, and a plurality of assistant elements are disposed between the temperature-sensitive elements and the respective heating elements to supplement an operation of the corresponding temperature-sensitive elements.

13. The mounting structure of claim 12, wherein the temperature-sensitive elements comprise electrolytic capacitors to smooth power of the heating elements and the assistant elements comprise ceramic capacitors to supplement the operation of the corresponding electrolytic capacitors.

14. The mounting structure of claim 13, wherein the electrolytic capacitors are spaced apart from all of the heating elements by approximately 10~35 mm.

15. The mounting structure of claim 13, wherein the ceramic capacitor comprises a film capacitor or a laminated ceramic capacitor.

16. The mounting structure of claim 13, wherein the plurality of heating elements may be any combination of a central processing unit (CPU), a voltage regulator, a motor driver, and a memory.

17. A mounting structure of an integrated circuit comprising:
a first heating element which generates a first heat;
a second heating element which generates a second heat;
a first temperature-sensitive element connected to the first heating element and disposed to be spaced apart from the first heating element by a first distance;
a second temperature-sensitive element connected to the second heating element and disposed to be spaced apart from the second heating element by a second distance;
a first assistant element which is less sensitive to heat than the first temperature-sensitive element is disposed in between the first heating element and the first temperature-sensitive element to supplement an operation of the first temperature-sensistive element; and
a second assistant element which is less sensitive to heat than the second temperature-sensitive element is disposed in between the second temperature-sensitive element to supplement an operation of the second temperature-sensitive-element.

18. The mounting structure of claim 17, wherein a first temperature of the first heat is higher than a second temperature of the second heat, and the first distance is longer than the second distance.

19. The mounting structure of claim 17, wherein the first distance and the second distance are determined according to a first temperature of the first heat and a second temperature of the second heat, respectively.

20. The mounting structure of claim 17, wherein the first distance is substantially 10~20 mm when a surface temperature of the first heating element is substantially 70~90° C.

21. The mounting structure of claim 17, wherein the second distance is substantially 20~35 mm when a surface temperature of the second heating element is substantially 90~120° C.

22. The mounting structure of claim 17, wherein the first temperature-sensitive element is disposed to be spaced apart from the second heating element by a third distance, and the first distance and the third distance are out of a range of a thermal effect of the first heating element and the second heating element respectively.

23. The mounting structure of claim 17, wherein the first heating element comprises one of a central processing unit (CPU), a voltage regulator, a motor drive and a memory, the first temperature-sensitive element comprises an electrolytic capacitor, and the first assistant element comprises a ceramic capacitor.

24. The mounting structure of claim 23, wherein the first assistant element comprises a film capacitor or a laminated ceramic capacitor.

* * * * *